United States Patent [19]
English et al.

[11] Patent Number: 6,067,233
[45] Date of Patent: May 23, 2000

[54] MOUNTING BRACE AND CABLE MANAGEMENT APPARATUS AND METHOD

[75] Inventors: Susan I. English, Chicago; Daniel J. Lecinski; Kenneth S. Laughlin, both of Arlington Heights, all of Ill.

[73] Assignee: 3Com Corporation, Rolling Meadows, Ill.

[21] Appl. No.: 09/032,673

[22] Filed: Feb. 27, 1998

[51] Int. Cl.[7] ........................................................ G06F 1/16
[52] U.S. Cl. .......................... 361/724; 361/825; 361/827; 174/135
[58] Field of Search .................................... 361/724, 725, 361/727, 685; 174/135, 60

[56] References Cited

U.S. PATENT DOCUMENTS

| | | | |
|---|---|---|---|
| 2,756,369 | 7/1956 | Gorrie | 361/724 |
| 4,288,838 | 9/1981 | Van Der Vegte et al. | |
| 5,398,159 | 3/1995 | Andersson et al. | 361/724 |
| 5,918,837 | 7/1999 | Vicain | 174/135 |

*Primary Examiner*—Leo P. Picard
*Assistant Examiner*—John Reed
*Attorney, Agent, or Firm*—Baniak Nicholas; Pine & Gannon

[57] ABSTRACT

A mounting brace and cable management apparatus includes a rigid bar including a body portion. The body portion includes a first end and a second end. A first leg portion extends substantially perpendicular from the first end. A second leg portion extends substantially perpendicular from the second end. A first flange portion extends from the first leg portion. A second flange portion extends from the second leg portion. The first and second flange portions each include an opening for receiving a fastener to fasten the first and second flange portions to a cabinet. The rigid bar can be mounted in a first position for securing an electronic module to the cabinet or a second position for routing cables. The rigid bar contacts a surface of the electronic module to prevent vertical movement of the electronic module within the cabinet when the rigid bar is mounted in the first position. The body portion includes a plurality of openings spaced along the body portion for receiving cable ties to secure and route cables when the rigid bar is mounted in the second position.

10 Claims, 3 Drawing Sheets

MOUNTING BRACE AND CABLE MANAGEMENT APPARATUS AND METHOD

FIELD OF THE INVENTION

This invention relates generally to an improved mounting brace and cable management apparatus for securing an electronic module to a cabinet and for routing cables within the cabinet. In particular, the invention relates to a mounting brace which can be mounted in a first position for securing an electronic device to a cabinet or a second position for routing cables.

BACKGROUND OF THE INVENTION

Electronic modules, such as switching and routing modules, are typically inserted into standardized racks in a vertically stacked configuration. Once the module is inserted into the rack, conventional fasteners are used to secure the front end of the module to the rack. This prevents any horizontal movement of the module within the rack. However, the back of the module must also be secured to prevent any vertical movement of the module that may be caused by an earthquake. Racks which house electronic modules must meet very stringent earthquake requirements in the United States and in other foreign countries.

Braces have been used to prevent the vertical movement of an electronic module caused by seismic activity. Typically, the braces have an L-shaped design and are secured to each side of the electronic module to prevent interference with the cable openings and other ports located on the back side of the module. The disadvantage of this arrangement is that racks which are housed in a cabinet or enclosed on the sides do not provide side access to allow the use of a side braces. In addition, the use of these side braces occasionally interferes with ports located along the sides of the module. Moreover, these devices cannot be used in an electronics cabinet having closed or covered sides. Finally, these braces cannot be used as a cable management apparatus for routing cables.

Accordingly, it would be desirable to have a mounting brace and cable management apparatus that overcomes the disadvantages described above, and to provide a simple and cost effective mounting brace and cable management apparatus.

SUMMARY OF THE INVENTION

One aspect of the invention provides a mounting brace and cable management apparatus. A rigid bar includes a body portion having a first end and a second end. A first leg portion extends substantially perpendicular from the first end and a second leg portion extends substantially perpendicular from the second end. A first flange portion extends from the first leg portion and a second flange portion extends from the second leg portion. The first and second flange portions each include an opening for receiving a fastener to fasten the first and second flange portions to a cabinet. The rigid bar can be mounted in a first position for securing an electronic module to the cabinet or a second position for routing cables. The body portion may include a plurality of openings spaced along the body portion for receiving cable ties to secure and route cables when the rigid bar is mounted in the second position. The rigid bar may contact a surface of the electronic module to prevent vertical movement of the electronic module within the cabinet when the rigid bar is mounted in the first position. The surface of the electronic module may be the top surface. The body portion may include a first rail portion and a second rail portion for stiffening the body portion. The bar may be formed from a single piece of steel.

Another aspect of the invention provides a mounting brace for securing an electronic module to a cabinet for housing electronic modules. A rigid bar for contacting a surface of the electronic module includes a body portion. The body portion includes a first end and a second end. A first leg portion extends substantially perpendicular from the first end and a second leg portion extends substantially perpendicular from the second end. A first flange portion extends from the first leg portion and a second flange portion extends from the second leg portion. The first and second flange portions each include an opening for receiving a fastener to fasten the first and second flange portions to the cabinet. The bar is positioned against the surface of the electronic module to secure the electronic module to the cabinet to prevent vertical movement of the electronic module within the cabinet. The opening may comprise a slot. The surface of the electronic module may be the top surface.

Another aspect of the invention provides a mounting brace and cable management apparatus. A cabinet includes a first rail and a second rail. The first and second rails are vertically oriented within the cabinet. The first and second rails each include a plurality of openings spaced along the first and second rails. An electronic module is housed within the cabinet. A rigid bar for contacting a surface of the electronic module includes a body portion. The body portion includes a first end and a second end. A first leg portion extends substantially perpendicular from the first end and a second leg portion extends substantially perpendicular from the second end. A first flange portion extends from the first leg portion and a second flange portion extends from the second leg portion. The first flange portion is fastened to the first rail and the second flange portion is fastened to the second rail. The bar is positioned against the surface of the electronic module to prevent vertical movement of the electronic module within the cabinet. The first flange portion and the second flange portion may each include an opening for receiving a fastener to fasten the first flange portion to the first rail and the second flange portion to the second rail. The opening may comprise a slot.

Another aspect of the invention provides a cable management apparatus. A cabinet includes a first rail and a second rail. The first and second rails are vertically oriented within the cabinet. The first and second rails each include a plurality of openings spaced along the first and second 30 rails. An electronic module is housed within the cabinet. A rigid bar for securing and routing cables includes a body portion. The body portion includes a plurality of openings spaced along the body portion for receiving cable ties to secure and rout the cables. The body portion further includes a first end and a second end. A first leg portion extends substantially perpendicular from the first end and a second leg portion extends substantially perpendicular from the second end. A first flange portion extends from the first leg portion and a second flange portion extends from the second leg portion. The first flange portion is fastened to the first rail and the second flange portion is fastened to the second rail.

Another aspect of the invention provides a method for securing an electronic module in a cabinet. A cabinet including a first rail and a second rail is provided. The first and second rails are vertically oriented within the cabinet. An electronic module housed within the cabinet and including a surface is also provided. A bar including a body portion is also provided.

The body portion includes a first end and a second end. A first leg portion extends substantially perpendicular from the first end and a second leg portion extends substantially perpendicular from the second end. A first flange portion extends from the first leg portion and a second flange portion extends from the second leg portion. The bar is oriented in a first position wherein the first and second legs extend inward from the first and second rails. The bar is positioned against the surface of the electronic module. The first flange portion is fastened to the first rail and the second flange portion is fastened to the second rail. Vertical movement of the electronic module within the cabinet is prevented.

Another aspect of the invention provides a method for routing cables in a cabinet for housing electronic modules. A cabinet including a first rail and a second rail is provided. The first and second rails are vertically oriented within the cabinet. An electronic module housed within the cabinet and including a surface is also provided. A bar including a body portion is also provided. The body portion includes a plurality of openings spaced along the body portion. The body portion further includes a first end and a second end. A first leg portion extends substantially perpendicular from the first end.

A second leg portion extends substantially perpendicular from the second end. A first flange portion extends from the first leg portion. A second flange portion extends from the second leg portion. The bar is oriented wherein the first and second legs extend outward from the first and second rails. The first flange portion is fastened to the first rail and the second flange portion is fastened to the second rail. A cable tie is inserted through at least one of the openings in the body portion. The cables are secured to the bar with the cable tie.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which are defined by the appended claims and equivalents thereof.

DETAILED DESCRIPTION OF THE DRAWINGS

DETAILED DESCRIPTION OF THE PRESENTLY PREFERRED EMBODIMENTS

Figure 1:
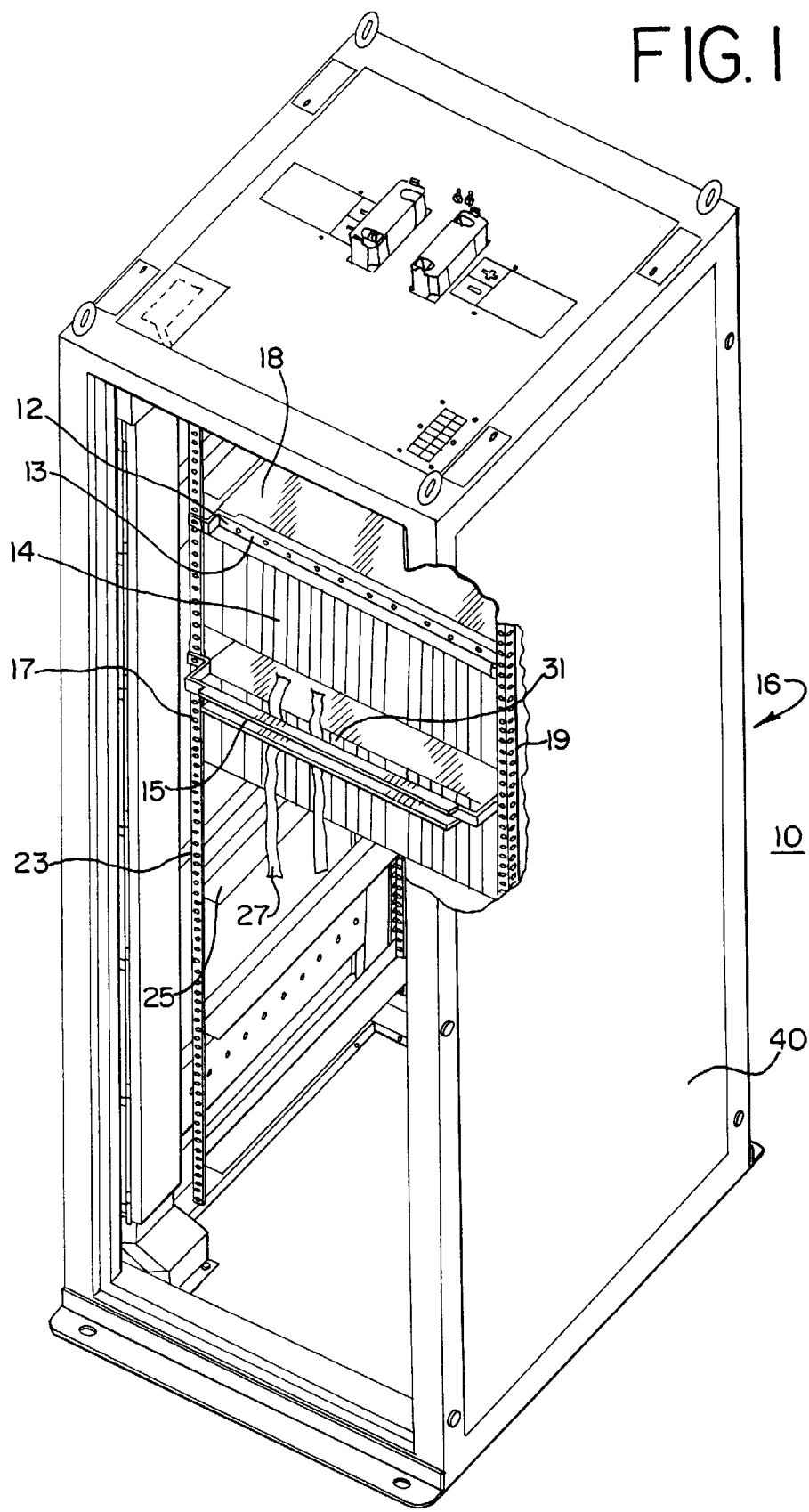
FIG. 1 is a perspective view of a preferred embodiment of a mounting brace and cable management apparatus which is made in accordance with the invention.
Figure 2:
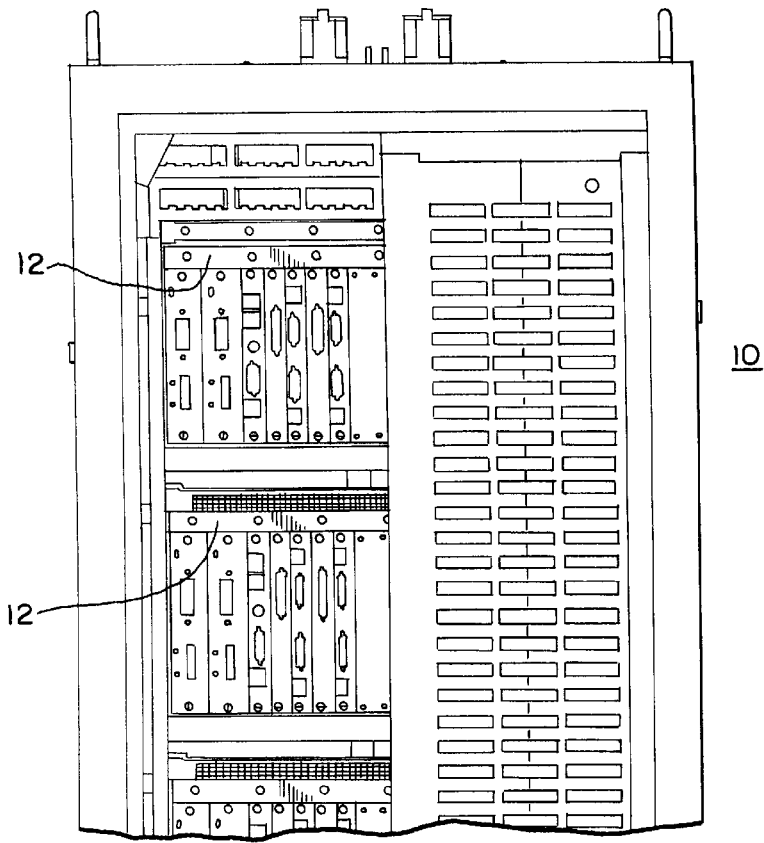
FIG. 2 is a partial front view of a preferred embodiment of a mounting brace and cable management apparatus which is made in accordance with the invention.
Figure 3:
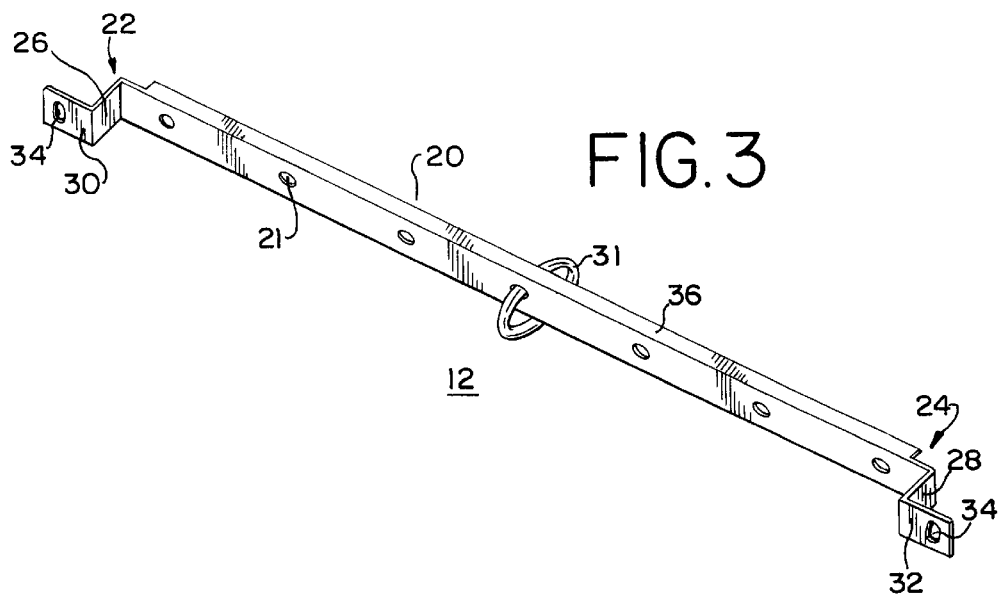
FIG. 3 is a perspective view of the rigid bar of the embodiment of FIG. 1.
Figure 4:
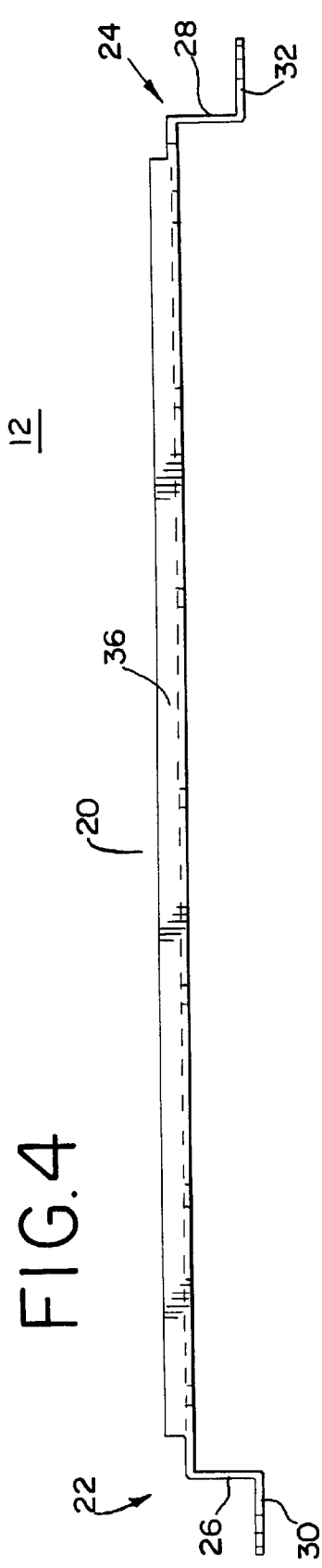
FIG. 4 is a front view of the rigid bar of FIG. 3.
Figure 5:
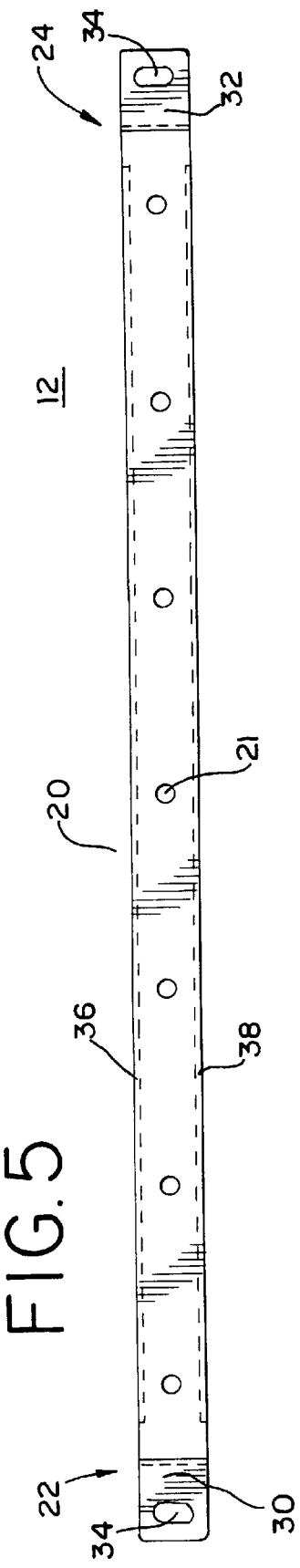
FIG. 5 is a bottom top view of the rigid bar of FIG. 3.
Figure 6:
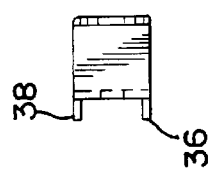
FIG. 6 is an end view of the rigid bar of FIG. 3.

As shown in FIGS. 1–2, a preferred embodiment of a mounting brace and cable management apparatus 10 includes a rigid bar 12. As shown in FIG. 1, the rigid bar 12 can be mounted in a first position 13 for securing an electronic module 14 to a cabinet 16 for housing electronic modules 14 or a second position 15 for routing cables 27. When the rigid bar 12 is mounted in the first position 13, the rigid bar 12 contacts a surface 18 of the electronic module 14 to prevent vertical movement of the electronic module 14 with the cabinet 16. In the embodiment shown, the surface 18 of the electronic module 14 is the top surface. The electronic module 14 may be any type of electronic device including, for example, an office router, a port expansion device, a managed modem pool device, an access concentrator, a redundant power device, a LAN switch, an edgeserver, and other types of modules.

As shown in FIG. 1, the cabinet 16 preferably includes a first rail 17 and a second rail 19 vertically disposed within the cabinet and positioned adjacent the side walls 40 of the cabinet 16. The first and second rails 17, 19 each include a plurality of openings 23 spaced along the first and second rails 17, 19. The cabinet 16 may be any of the commercially available cabinets for housing electronic modules 14. As shown in FIG. 1, the electronic module 14 is supported by shelf members 25 which are located adjacent the side walls 40 of the cabinet 16.

As shown in FIGS. 3–6, the rigid bar 12 includes a body portion 20.

The body portion 20 includes a plurality of openings 21 spaced along the body portion 20 for receiving cable ties 31 to secure and rout cables 27 when the rigid bar 12 is mounted in the second position 15. The body portion 20 includes a first end 22 and a second end 24. A first leg portion 26 extends substantially perpendicular from the first end 22. A second leg portion 28 extends substantially perpendicular from the second end 24. A first flange portion 30 extends from the first leg portion 26. A second flange portion 32 extends from the second leg portion 28.

The body portion 20 may preferably include a first rail portion 36 and a second rail portion 38 for stiffening the body portion 20. The rigid bar 12 may preferably be formed from a single piece of rigid material such as steel.

The first and second flange portions 30, 32 each include an opening 34 for receiving a fastener to fasten the first and second flange portions 30, 32 to the cabinet 16. In the embodiment shown, the first flange portion 30 is fastened to the first rail 17 and the second flange portion 32 is fastened to the second rail 19. Any conventional fastener, such as screws, bolts, or rivets may be used to fasten the first flange portion 30 to the first rail 17 and the second flange portion 32 to the second rail 19. The opening 34 may preferably be a slot to allow the rigid bar 12 to be adjusted in the vertical direction to provide a secure contact between the rigid bar 12 and the top surface 18 of the electronic module 14 when the rigid bar is in the first position 13.

The apparatus shown in FIGS. 1–6 is used for securing an electronic module 14 in a cabinet 16. The rigid bar 12 is oriented in a first position 13 wherein the first and second legs 26, 28 extend inward from the first and second rails 17, 19 of the cabinet 16. The rigid bar 12 is positioned against the surface 18 of the electronic module 14 to prevent vertical movement of the electronic module 14 within the cabinet 16. The first flange portion 30 is fastened to the first rail 17 and the second flange portion 32 is fastened to the second rail 19.

The apparatus shown in FIGS. 1–6 may also be reversed easily and quickly for routing cables 27 in a cabinet 16 for housing electronic modules 14. As shown in FIG. 1, the rigid bar 12 is oriented in a second position 15 wherein the first and second legs 26, 28 extend outward from the first and second rails 17, 19 of the cabinet 16. The first flange portion 30 is fastened to the first rail 17 and the second flange portion 32 is fastened to the second rail 19. A cable tie 31, for example, may be inserted into at least one of the openings 21 in the body portion 20. The cables 27 are secured to the rigid bar 12 with the cable tie 31. The cable tie 31 may include any flexible member which will fit through the opening 21. One advantage of this invention is that the rigid bar 12 can function as both a mounting brace (in the first position 13) and a cable management system (in the second position 15) thereby eliminating the need for two separate devices and reducing costs and saving space within the cabinet 16. Moreover, the rigid bar 12 performs the function of securing the electronic module 14 to the cabinet 16 without interfering with the cable openings and other various ports located on the rear and side faces of the electronic module 14.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A mounting brace and cable management apparatus comprising:

a rigid bar including a body portion, the body portion including a first end and a second end, a first leg portion extending substantially perpendicular from the first end, a second leg portion extending substantially perpendicular from the second end, a first flange portion extending from the first leg portion, a second flange portion extending from the second leg portion, the first and second flange portions each including an opening for receiving a fastener to fasten the first and second flange portions to a cabinet, the rigid bar interchangeably mounted between in a first position contacting a surface of the electronic module to prevent vertical movement of the electronic module within the cabinet, and a second position to route cables.

2. The apparatus of claim 1 wherein the body portion includes a plurality of openings spaced along the body portion for receiving cables ties to secure and route cables when the rigid bar is mounted in the second position.

3. The apparatus of claim 1 wherein the surface of the electronic module is the top surface.

4. The apparatus of claim 1 wherein the body portion includes a first rail portion and a second rail portion for stiffening the body portion.

5. The apparatus of claim 1 wherein the bar is formed from a single piece of steel.

6. The apparatus of claim 1 wherein the opening comprises a slot.

7. A mounting brace and cable management apparatus comprising:

a cabinet including a first rail and a second rail, the first and second rails vertically oriented within the cabinet, the first and second rails each including a plurality of openings spaced along the first and second rails;

an electronic module housed within the cabinet;

a rigid bar including a body portion, the body portion including a plurality of openings formed therein and spaced along the body portion for receiving cable ties to secure and route cables, the body portion further including a first end and a second end, a first leg portion extending substantially perpendicular from the first end, a second leg portion extending substantially perpendicular from the second end, a first flange portion extending from the first leg portion, a second flange portion extending from the second leg portion, the first flange portion fastened to the first rail and the second flange portion fastened to the second rail, the rigid bar interchangeably mounted between a first position contacting a surface of the electronic module to prevent vertical movement of the electronic module within the cabinet, and a second position to route cables.

8. The apparatus of claim 7 wherein the first flange portion and the second flange portion each include an opening for receiving a fastener to fasten the first flange portion to the first rail and the second flange portion to the second rail.

9. A method for securing an electronic module in a cabinet comprising:

providing a cabinet including a first rail and a second rail, the first and second rails vertically oriented within the cabinet, an electronic module housed within the cabinet and including a surface, a rigid bar extending from the first rail to the second rail, the rigid bar including a body portion, the body portion including a first end and a second end, a first leg portion extending substantially perpendicular from the first end, a second leg portion extending substantially perpendicular from the second end, a first flange portion extending from the first leg portion, a second flange portion extending from the second leg portion;

orienting the rigid bar in a first position wherein the first and second legs extend inward from the first and second rails;

positioning the rigid bar against the surface of the electronic module;

fastening the first flange portion to the first rail and the second flange portion to the second rail; and, preventing vertical movement of the electronic module within the cabinet.

10. A method for routing cables comprising:

providing a cabinet for housing electronic modules including a first rail and a second rail, the first and second rails vertically oriented within the cabinet, an electronic module housed within the cabinet and including a surface, a rigid bar extending from the first rail to the second rail, the rigid bar including a body portion, the body portion including a plurality of openings spaced along the body portion, the body portion further including a first end and a second end, a first leg portion extending substantially perpendicular from the first end, a second leg portion extending substantially perpendicular from the second end, a first flange portion extending from the first leg portion, a second flange portion extending from the second leg portion;

orienting the rigid bar wherein the first and second legs extend outward from the first and second rails;

fastening the first flange portion to the first rail and the second flange portion to the second rail;

inserting a cable tie through at least one of the openings in the body portion; and securing the cables to the rigid bar with the cable tie.

* * * * *